United States Patent
Kauffman et al.

(10) Patent No.: US 9,729,103 B2
(45) Date of Patent: Aug. 8, 2017

(54) REINFORCEMENT PV LAMINATE

(71) Applicant: DOW GLOBAL TECHNOLOGIES LLC, Midland, MI (US)

(72) Inventors: Keith L. Kauffman, Ypsilanti, MI (US); Kwanho Yang, Midland, MI (US); Jie Feng, Midland, MI (US); Hua Liu, Midland, MI (US); Scott T. Burr, Midland, MI (US); Rebekah K. Feist, Midland, MI (US); Rahul Sharma, Lake Jackson, TX (US); Leonardo Lopez, Midland, MI (US)

(73) Assignee: Dow Global Technologies, LLC, Midland, MI (US)

( * ) Notice: Subject to any disclaimer, the term of this patent is extended or adjusted under 35 U.S.C. 154(b) by 0 days.

(21) Appl. No.: 14/440,428

(22) PCT Filed: Nov. 25, 2013

(86) PCT No.: PCT/US2013/071581
§ 371 (c)(1),
(2) Date: May 4, 2015

(87) PCT Pub. No.: WO2014/099276
PCT Pub. Date: Jun. 26, 2014

(65) Prior Publication Data
US 2015/0287856 A1    Oct. 8, 2015

Related U.S. Application Data

(60) Provisional application No. 61/738,723, filed on Dec. 18, 2012.

(51) Int. Cl.
*H01L 31/042* (2014.01)
*H02N 6/00* (2006.01)
(Continued)

(52) U.S. Cl.
CPC ............ *H02S 30/10* (2014.12); *H01L 31/048* (2013.01); *H01L 31/049* (2014.12);
(Continued)

(58) Field of Classification Search
CPC ....... H01L 31/048; H01L 31/05; H02S 30/00; H02S 30/10; H02S 20/00; H02S 20/23;
(Continued)

(56) References Cited

U.S. PATENT DOCUMENTS 4,101,101 A * 7/1978 Barkats .................. F24J 2/5211
                                                        136/245
4,394,529 A    7/1983 Gounder
(Continued)

FOREIGN PATENT DOCUMENTS

CN    101371368 A    2/2009
CN    101976693 A    2/2011
(Continued)

OTHER PUBLICATIONS

English machine translation of CN101976693A.*
(Continued)

*Primary Examiner* — Lindsey Bernier
(74) *Attorney, Agent, or Firm* — The Dobrusin Law Firm, PC; Daniel P. Aleksynas (57) ABSTRACT

A solar module (2) comprising: (a) a plurality of interconnected photovoltaic cells (4); (b) a forward protective layer (22); (c) a rearward protective layer (24); and (d) an reinforcement (10); wherein the reinforcement is integrally located within the solar module and extends from a location substantially proximate to the forward protective layer to a location substantially proximate to the rearward protective layer.

15 Claims, 5 Drawing Sheets

(51) Int. Cl.
*H02S 30/10* (2014.01)
*H01L 31/048* (2014.01)
*H01L 31/049* (2014.01)
*H01L 31/05* (2014.01)
*H02S 20/25* (2014.01)

(52) U.S. Cl.
CPC .......... *H01L 31/0488* (2013.01); *H01L 31/05* (2013.01); *H02S 20/25* (2014.12); *Y02E 10/50* (2013.01)

(58) Field of Classification Search
CPC ....... H02S 20/25; Y02E 10/50; Y02E 10/545; Y02E 10/546; Y02E 10/547
USPC .......................... 136/244, 251, 252, 258, 259
See application file for complete search history.

(56) References Cited

U.S. PATENT DOCUMENTS

| | | | |
|---|---|---|---|
| 5,228,925 A * | 7/1993 | Nath | ................. H01L 31/048 136/251 |
| 5,776,262 A | 7/1998 | Melchoir | |
| 6,111,189 A * | 8/2000 | Garvison | ............... F24J 2/5211 126/621 |
| 7,238,879 B2 | 7/2007 | Matshushita et al. | |
| 2001/0054435 A1 | 12/2001 | Nagao et al. | |
| 2008/0149163 A1* | 6/2008 | Gangemi | .......... H01L 31/02008 136/246 |
| 2008/0156365 A1* | 7/2008 | Scholz | ................. H01L 31/048 136/251 |
| 2009/0283136 A1 | 11/2009 | Munch et al. | |
| 2010/0132761 A1 | 6/2010 | Echizenya et al. | |
| 2011/0000524 A1 | 1/2011 | Busch et al. | |
| 2011/0017265 A1 | 1/2011 | Farrell | |
| 2011/0083720 A1* | 4/2011 | Merkle | ................. H01L 31/048 136/246 |
| 2011/0220183 A1 | 9/2011 | Mills et al. | |
| 2011/0232728 A1 | 9/2011 | Mun | |
| 2012/0037214 A1 | 2/2012 | Sagayama | |
| 2012/0097219 A1 | 4/2012 | Takagi et al. | |
| 2012/0118349 A1 | 5/2012 | Keenihan et al. | |

FOREIGN PATENT DOCUMENTS

| | | |
|---|---|---|
| CN | 102412328 A | 4/2012 |
| CN | 202259350 U | 5/2012 |
| CN | 202259374 U | 5/2013 |
| DE | 202011003896 U1 | 6/2012 |
| EP | 1708280 A1 | 10/2006 |
| EP | 2437307 A1 | 4/2012 |
| WO | 2005078808 A1 | 8/2005 |
| WO | 2010129420 A1 | 11/2010 |
| WO | 2012078491 A1 | 6/2012 |

OTHER PUBLICATIONS

PCT and Search Report for International Application No. PCT/US2013/071581 dated Apr. 7, 2013.
Written Opinion of the International Preliminary Examining Authority, International Application No. PCT/2013/071581, dated Feb. 20, 2015.
Notification of transmittal of the IPRP, International Application No. PCT/2013/071581, dated Apr. 24, 2015.
The Patent Office of the People's Republic of China First Office Action dated May 30, 2016, for Application No. 2013800641358.
Feng et al., College Physical Experiment, China Machine Press, pp. 298-299, Jan. 31, 2009.
Second Office Action from the Patent Office of the People's Republic of China for Application No. 2013800641358, issued Jan. 16, 2017.

* cited by examiner

REINFORCEMENT PV LAMINATE

FIELD

The present teachings generally relate to a reinforcement for a solar module and more particularly a solar module with an integral reinforcement.

BACKGROUND

Typically, solar arrays are placed in an elevated location such as a roof top of a home or a building so that the solar array is exposed to sunlight. Roofs on homes and buildings generally are formed by adding a plurality of pieces of panels together so that one generally contiguous roofing surface is formed. The plurality of pieces of panels are supported by one or more support beams. Solar modules may be secured to the plurality of pieces of panels directly and/or indirectly via a connection structure. The plurality of pieces of panels may move when weight is applied to each panel, which may cause the adjoined solar modules to move and flex. The movement may cause flexing and bending of the solar modules which may damage the solar modules. Additionally, locating the solar modules in an elevated location may subject the solar modules to environmental conditions such as flying debris, hail, or the like that may impact and damage the solar modules. It would be attractive to have a solar module which is resistant to dynamic loading, static loading, or both.

Examples of some known solar modules may be found in U.S. Pat. No. 7,238,879 and U.S. Patent Application Publication Nos. 2001/0054435; 2009/0283136; 2010/0132761; 2011/0220183; 2012/0097219; and 2012/0118349 all of which are incorporated by reference herein for all purposes. Examples of reinforcement structures for solar modules may be found in U.S. Pat. Nos. 4,394,529 and 5,776,262; U.S. Patent Application Nos. 2011/0000524; 2011/0232728; 2012/0037214; and 2012/0097219; and International Patent Nos. WO2005/078808 and WO2010/129420 all of which are incorporated by reference herein for all purposes.

It would be attractive to have a device that provides protection to a solar module from static loading such as a person walking on a roof and/or the solar modules. It would be attractive to have a device that provides protection to a solar module from dynamic loading such as an impact from flying debris and/or hail. What is needed is a reinforcement that protects the individual cells in a solar module and does not require the solar modules to be placed in a discrete structure that encases the solar module.

SUMMARY

The present teachings meet one or more of the present needs by providing: a solar module comprising: a plurality of interconnected photovoltaic cells; (a) a forward protective layer; (b) a rearward protective layer; and (c) a reinforcement; wherein the reinforcement is integrally located within the solar module and extends from a location substantially proximate to the forward protective layer to a location substantially proximate to the rearward protective layer.

One possible embodiment of the present teachings include: a solar array comprising: a plurality of solar modules of the teachings herein; wherein the plurality of solar modules are directly attached to a connection surface.

The teachings herein surprisingly solve one or more of these problems by providing a device that protects a solar module from static loading such as a person walking on a roof and/or the solar modules. The teachings herein provide a device that protects a solar module from dynamic loading such as an impact from flying debris and/or hail. The teachings herein are a reinforcement that protects the individual cells in a solar module and does not require the solar modules to be placed in a discrete structure that encases the solar module.

DETAILED DESCRIPTION

The explanations and illustrations presented herein are intended to acquaint others skilled in the art with the teachings, its principles, and its practical application. Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

A reinforcement as discussed herein is included in one or more solar modules. A plurality of solar modules are combined together to form a solar array. The solar array collects sunlight and converts the sunlight to electricity. Generally, each of the solar modules may be individually placed in a structure that houses all of the solar modules forming all or a portion of a solar array. The solar modules of the teachings herein may be used with a housing that contains all of the individual solar modules that make up a solar array. Preferably, the solar array taught herein is free of a separate structure that houses all of the solar modules that make up a solar array. More preferably, each individual solar module may be connected directly to a structure and each of the individual solar modules is electrically connected together so that a solar array is formed. Most preferably, each individual solar module may include a reinforcement so that each solar module may be protected and connected to a connection surface. Each of the solar modules may be indirectly and/or directly connected to a connection surface. Preferably, each of the solar modules may be directly connected to a connection surface.

The connection surface may be any surface that provides support to one or more solar modules so that a solar array is formed. The connection surface may be a support structure such as a housing for containing one or more of the solar modules. The connection surface may be a roof. The roof may be made of any material that has sufficient strength to support the weight of the plurality of solar modules. The roof may be made of any material so that the plurality of solar modules may be directly connected to the roof. The roof may be comprised of a plurality of panels made of wood, plywood, structural plywood, decorative plywood, overlaid plywood, commercial plywood, utility plywood, marine plywood, medium density fiberboard (MOF), oriented strand board (OSB). Sundela, hardboard, insulation board, the like, or a combination thereof. The plurality of solar modules may be connected to the connection surface so that the solar modules are adjacent to one another. For example, an edge of one solar module may be located substantially proximate to en edge of an adjoining solar module. The solar modules may partially overlap each other. For example, one solar module may overlap a portion of another solar module in a similar fashion to how roofing shingles are applied to a roof.

The plurality of solar modules may be configured in any manner so that each of the plurality of solar modules may be electrically connected. Each of the individual solar modules may be electrically connected to an adjacent solar module by one or more interconnect elements. The one or more interconnect element may be a ribbon, a positive buss bar, a negative buss bar, a connector, an integrated flashing piece, or a combination thereof. Preferably, the interconnect elements are ribbons that extend between two or more adjacent cells. The plurality of solar modules may be connected to the roof by any fastener that has sufficient strength to withstand environmental conditions and form a secure connection. The plurality of solar modules may be connected with a mechanical fastener, an adhesive, an interlocking connection with an adjacent solar module and/or a connection surface, or a combination thereof. The fastener may be a screw, nail, bolt, staple, or a combination thereof. The adhesive may be any adhesive with sufficient strength to connect the solar module to the roof panels. The adhesive may be epoxy based, silicone based, acrylic based, a urethane, a polyamide, a one part adhesive, a multi-part adhesive, a natural adhesive, a synthetic adhesive, or a combination thereof. The connection may be a permanent connection, a removable connection, or both so that a solar module is connected to a connection surface. The solar modules may be lightweight and have a low profile so that the solar modules may be connected directly to the connection surface.

The solar module may have any thickness so that the solar module may be directly connected to a connection surface. The solar module may have a thickness $T_o$. The thickness of the solar module may be about 2 mm or more, preferably about 5 mm or more, or more preferably about 8 mm or more. The thickness of the solar module may be about 50 mm or less, about 30 mm or less, preferably about 20 mm or less, more preferably about 15 mm or less, or most preferably about 10 mm or less. The thickness of the solar module may be about 3 mm or more, preferably about 4 mm or more, or more preferably about 5 mm or more (i.e., from about 6 mm to about 8 mm). The solar module may be sufficiently thick so that the solar module includes a sufficient amount of material so that the solar module produces electricity.

The solar modules may be made of any material so that when sunlight is directed on the solar module the sunlight is converted into electricity. The solar modules may be made of one or more solar cells having a photoactive portion. Preferably, the solar modules are made of a plurality of solar cells. The solar cells may be made of any material that assists in converting sunlight into electricity. The solar cells may be of any type and material known in the art. Some no examples of materials that the solar cells may be made of include copper chalcogenide type cells (e.g. copper gallium selenides, copper indium gallium selenides, copper indium selenides, copper indium gallium sulfides, copper indium sulfides, copper indium gallium selenides sulfides, etc. (i.e., known generally as CIGSS)), amorphous silicon cells, crystalline silicon cells, thin-film III-V cells, thin-film II-VI cells, IB-IIIA-chalcogenide (e.g., IB-IIIA-selenides, IB-IIIA-sulfides, or IB-IIIA-selenide sulfides), organic photo-voltaics, nanoparticle photo-voltaics, dye sensitized solar cells, and/or combinations of the described materials. In one specific example, the copper indium gallium selenides may be represented by the formula $CuIn(1-x)GaxSe(2-y)Sy$ where x is 0 to 1 and y is 0 to 2. Preferably, each solar cell includes a crystalline silicon element. Additional electroactive layers such as one or more of emitter (buffer) layers, conductive layers (e.g. transparent conductive layers) or the like maybe used in CIGSS based solar cells are contemplated by the teachings herein. The solar cells may be flexible or rigid and come in a variety of shapes and sizes, but generally are fragile and subject to environmental degradation. In a preferred embodiment, the solar cell assembly is a cell that can bend without substantial cracking and/or without significant loss of functionality. Other materials and/or combinations are contemplated herein especially those compositions disclosed in paragraph 0054 of U.S. Patent Application Publication No. 2012/0118349, which is incorporated herein by reference as to materials for solar cells. The solar cells may be arranged in parallel, series, mixed series-parallel, and/or may be provided in independent circuits. The electrical assemblies may be any electrical assembly discussed herein. The solar cells may be part of an assembly, and preferably are one layer in an assembly.

The assembly may include one or more of the following components: a forward protective layer, a rearward protective layer, a reinforcement, a solar cell, one or more internal protecting layer, or a combination thereof. One or more of the layers discussed herein may be a combination of layers. For example, a forward protective layer may be a combination of multiple glass layers combined together. As another example, the reinforcement may be a plurality of layers bonded together. As discussed herein, each individual layer may include an adhesive so that one or more layers are bonded together forming a layer, each layer may include an adhesive over and/or under another layer so that the one or more adjacent layers are bonded together. Other components and layers of the solar module are contemplated herein that may be used with the reinforcement taught herein especially those components, layers, and/or materials disclosed in Paragraph Nos. 0048-0053 of U.S. Patent Application Publication No. 2012/0118349, and Paragraph Nos. 0027-0038 and FIGS. 2A and 2B 2011/0220183, both of which are expressly incorporated herein by reference as to components, layers, and/or materials for solar cells that may be used in conjunction with the reinforcement and solar module discussed herein. The solar module assembly and/or subassembly may have an overall CLTE that ranges from about $30 \times 10^{-6}$ mm/mm° C. to $150 \times 10^{-6}$ mm/mm° C., more preferably about $50 \times 10^{-6}$ mm/mm° C. to $100 \times 10^{-6}$ mm/mm° C. One or more of the layers of the solar cell may be electrical circuitry.

The electrical circuitry of the solar cells may be one or more buss bars, one or more ribbons, or both. The electrical circuitry may extend from cell to cell, solar module to solar module, cell to a solar module, or a combination thereof. The electrical circuitry may be integrated into the one or more solar cells, connect the one or more solar cells, be electrically connected to the one or more solar cells, or a combination thereof. The electrical circuitry may be integrated into and/or around one or more layers of the solar module such as the reinforcement.

Preferably, at least one component of the assembly is a reinforcement. More preferably, the assembly includes one or more solar cells and a reinforcement surrounding each of the one or more solar cells. The solar cells may be partially or entirely surrounded by one or more reinforcements that protect each of the one or more solar cells.

The reinforcement may be any reinforcement with sufficient strength so that the reinforcement protects the solar cells from static loading, dynamic loading, or both. The reinforcement may have sufficient strength so that each of the solar cells, the solar modules, or both are substantially free of deflection during static loading, dynamic loading, or both. The reinforcement may have any shape and/or configuration so that the reinforcement substantially prevents bending, flexing, twisting, or a combination thereof of each individual solar cell, the solar module, or both. The reinforcement may be an external structure that partially and/or entirely surrounds each solar cell in a solar module. Preferably, the reinforcement is an internal structure that is partially and/or entirely incorporated into the solar module so that the reinforcement protects the solar cells. More preferably, the reinforcement is an integral part of the solar module and is incorporated between each individual solar cell. Even more preferably, the reinforcement is part of the solar module so that the solar module and reinforcement may be directly connected to a support structure so that the solar module and reinforcement are free of a separate connecting step.

The reinforcement may be made of any material so that the reinforcement has sufficient strength so that the reinforcement substantially prevents deflection of the one or more solar cells, the solar module, or both. The reinforcement may be made of an insulating material, may be coated with an insulating material, may have portions that are insulating, or a combination thereof. Preferably, the reinforcement may be made of an insulating material with high strength. The reinforcement material may be made of any material with a coefficient of thermal expansion that is substantially equal to the coefficient of thermal expansion of the material of the solar cells. The reinforcement may be made of a material with a substantially similar coefficients of thermal expansion as the solar cells, the forward protective layer, the rearward protective layer, or a combination thereof so that the solar modules are free of cracking, bending, wear between the solar modules, buckling, warping, one solar module pushing over another solar module, delamination of one or more layers, damage to one or more encapsulating layers, damage to the connectors, damage to the integrated flashing pieces, or a combination thereof. The reinforcement material may be made of a material with a coefficient of thermal expansion of about 4 ppm/C or more, about 7 ppm/C or more, or about 10 ppm/C or more. The reinforcement material may be made of a material with a coefficient of thermal expansion from about 4 ppm/C to about 30 ppm/C, preferably about 5 ppm/C to about 24 ppm/C, and more preferably about 7 ppm/C to about 20 ppm/C. The reinforcement may be made of any material that is lightweight, thin, rigid, low-profile, or a combination thereof. The material may be any material that substantially prevents deflection. The material may be any material that can withstand a static load, a dynamic load, or both. The reinforcement may be made of any rigid material, which may provide support, prevent deflection, prevent bending, prevent twisting, prevent flexing, or a combination thereof of the plurality of cells and/or the solar module. The reinforcement may be made of a natural material, a synthetic material, a composite, a polymer, a plastic, metal, ceramic, glass, a reinforced material, a coated material, or a combination thereof. Preferably, the reinforcement is made of aluminum, glass, ceramic, a reinforced polymer composite, a coated reinforcement, or a combination thereof. The reinforcement may be made of a material that may be made by one or more of the following processes: injection molding, blow molding, compression molding, extrusion molding, plastic molding, rotational molding, thermoforming, or a combination thereof.

The material of the reinforcement may have a higher stiffness than a solar module that does not include the reinforcement. The material of the solar module may have a sufficient elastic modulus so the reinforcement prevents the solar cells from bending, twisting, flexing, or a combination thereof so that each of the plurality of solar cells is not damaged. The material of the solar modules may have a sufficient elastic modulus so that the solar modules are substantially free of deflection during a static load, a dynamic load, or both as discussed herein. The material of the reinforcement may have an elastic modulus higher than glass. The elastic modulus of the material may be about 10 GPa or more, about 20 GPa or more, about 30 GPA or more, preferably about 40 GPa or more, more preferably about 50 GPa or more, or even more preferably about 60 GPa or more. The material may have an elastic modulus that is less than steel. The elastic modulus of the material may be about 300 GPa or less or about 250 GPa or less. The reinforcement may have any configuration so that the reinforcement provides support to the one or more solar cells, the one or more solar modules, or both.

The reinforcement may have an internal structure that is corrugated, honeycomb, solid, porous, hollow, or a combination thereof. For example, a cross-section of the reinforcement may be a hollow box structure. In another example, a cross-section may have an outer structure with an interconnecting network inside of the outer structure that forms a honeycomb structure. A cross-section of the reinforcement may be any shape that prevents deflection of the reinforcement so that the reinforcement protects the solar cells, the solar module, or both. The cross-section of the reinforcement may be geometric, square, rectangular, diamond, triangular, octagonal, symmetrical, non-symmetrical, the like, or a combination thereof. The reinforcement may have a structure so that any load applied is displaced throughout the solar module.

The reinforcement may include one or more structures that surround each cell of the solar module so that any load applied to the solar module is distributed throughout the reinforcement. The reinforcement may include an inner frame, an outer frame, or both. During a load apply, the load may be applied to the inner frame, the outer frame, or preferably both so that the reinforcement substantially prevents deflection of the solar module and so that the cells are protected. The reinforcement may be configured so that a load applied to a forward protective layer, a rearward protective layer, or both may prevent the forward protective layer, the rearward protective layer, or both from deflecting into contact with a cell. The reinforcement may have sufficient strength so that the reinforcement may withstand a static load of 50 Kg or more, preferably about 75 Kg or more, more preferably about 100 Kg or more, or even more preferably about 125 Kg or more. The reinforcement may have sufficient strength so that the reinforcement may withstand a dynamic load having a kinetic energy of about 2 J or more, preferably about 6 J or more, more preferably about 10 J or more, even more preferably about 15 J or more, or most preferably about 20 J or more. An example of one test method that may be used to test the impact strength of a solar module is IEC 61646. In one example, the solar module may have sufficient strength so that the solar module may withstand an impact from an ice ball having a 45 mm diameter and a mass of about 45 grams traveling at a velocity of about 30 m/s. The reinforcement structure may include one or more inner frames, one or more outer frames, or both so that the dynamic forces are displaced and absorbed by the reinforcement so that the forward protective surface, the solar cell, or both are not damaged.

The outer frame may extend partially end/or entirely around an outer edge of a solar module. The outer frame may extend partially and/or entirely around a periphery of a solar module. The outer frame may surround an inner frame. The inner frame may be a separate component from the outer frame. The inner frame and the outer frame may be one unitary piece. The inner frame and the outer frame may be integrally connected. The inner frame may partially and/or entirely surround one or more solar cells. The inner frame may entirely and/or partially form a periphery around each solar cell. The inner frame and the outer frame together may partially and/or entirely surround each solar cell. The inner frame, the outer frame, or both may be made of one or more discrete segments. For example, the inner frame may be comprised of multiple discrete segments with channels formed between each discrete segment. The inner frame, the outer frame, or both may form one or more windows in the reinforcement that accommodate one or more cells.

The one or more windows may be any size and shape so that each window may house one or more solar cells. The windows may be any size and shape so that light is transmitted to each solar cell and the reinforcement provides a sufficient amount of strength to each solar cell so that each solar cells is protected from damage. The one or more windows may be a through hole in the reinforcement. For example, the reinforcement may be free of contact from the one or more solar cells along a front edge, a rear edge, a side edge, a front surface, a rear surface, or a combination thereof. In another example, the reinforcement may only be located around a periphery of each solar cell so that a forward surface, a rearward surface, or both are free of contact from the reinforcement. The rear protective layer may be in contact with the one or more cells so that the rear protective layer provides support to each of the one or more cells. Each window may be comprised of the inner frame, the outer frame, or both. The inner frame, the outer frame, or both may include one or more channels.

The one or more channels may be any size and shape so that the two adjacent solar modules may be electrically connected, physically connected, or both. The one or more channels may be any size and shape so that one or more interconnect elements may extend through a channel and connect two or more adjacent solar modules together. The one or more channels may be any size and shape so that one or more ribbons, one or more buss bars, one or more connectors, one or more integrated flashing pieces, or a combination thereof may extend through the channel. The channels may be formed in an upper portion, a lower portion, a central portion, or a combination thereof of the inner frame, the lower frame or both. The one or more channels may extend completely through the inner frame, the outer frame, or both. The one or more channels may be an absence of material.

The channels may be formed between two adjacent segments of the reinforcement. For example, a segment consisting of the inner frame, the outer frame, or both may terminate and another segment may begin, which forms a channel through the inner frame, the outer frame, or both. A segment may be any portion of a reinforcement that forms a discrete structure, includes one or more ends that terminate, is free of a connection to an adjacent portion of the reinforcement, or a combination thereof. A segment may have any length, width, thickness, or a combination thereof so that each segment of the reinforcement assists in protecting each solar cell, a solar module, or both. Preferably, the thickness of each segment is substantially equal so that the solar module has a substantially constant thickness.

The thickness of the solar module may be any thickness so that the solar module produces electricity when the solar module is contacted by light. The thickness of the solar module may be any thickness so that each cell in the solar module is sufficiently thick so that each cell produces electricity. The thickness of the solar module may be any thickness so that the solar module may be connected indirectly to a support structure. Preferably, the solar module has a thickness so that the solar module may be directly connected to a support structure. More preferably, the solar module has a thickness so that one solar module may at least partially overlap an adjacent solar module. A thickness of the reinforcement may be the same as the overall thickness of a solar module. A thickness of a reinforcement may be substantially equal to an overall thickness of the solar module. The overall thickness of the solar module as discussed herein may be a thickness $T_o$. The thickness of the reinforcement may be about $T_o$, about $T_o-0.5$ mm, about $T_o-1.0$ mm, about $T_o-1.2$ mm, or about $T_o-1.5$ mm. The thickness of the reinforcement may be about 1.0 mm or more, about 1.2 mm or more, about 1.5 mm or more (i.e., about 1.7 mm). The thickness of the reinforcement may be about 48 mm or less, about 30 mm or less, about 20 mm or less, about 14 mm or less, or about 9 mm or less. Preferably, the reinforcement has a thickness that is less than the overall thickness of the solar module. More preferably, the reinforcement has a thickness that is less than the overall thickness by a thickness of a forward protective layer, a rearward protective layer, or both.

The forward protective layer and the rearward protective layer may be made of the same material. The forward protective layer and the rearward protective layer may be made of different materials. The forward protective layer, the rearward protective layer, or both may be made of any material that may protect the solar module from a static load, a dynamic load, a fluid, dirt, debris, or a combination thereof. The forward protective layer, the rearward protective layer, or both may substantially encapsulate a forward surface, a rearward, surface, or both of the solar module. The forward protective layer, the rearward protective layer, or both may be substantially transparent, completely transparent, or both. Preferably, sunlight may penetrate the forward protective layer so that electricity may be created by the solar cells, the solar module, or both. The forward protective layer may be made of any material that allows sunlight to pass through so that electricity may be created by the solar module. The forward protective layer may be made of any material that acts as a protective shield for the one or more solar cells. The forward protective layer may be flexible (e.g. a thin polymeric film, a multi-layer film, glass, or glass composite) or be rigid (e.g. a thick glass or Plexiglas such as polycarbonate). The forward protective layer may be resistant to moisture and/or particle penetration or build-up. The forward protective layer may filter certain wavelengths of light so that unpreferred wavelengths may not reach the photovoltaic cells. In a preferred embodiment, forward protective layer may have a thickness from about 0.05 mm to 10.0 mm, more preferably from about 0.1 mm to 4.0 mm, and most preferably from 2.5 mm to 3.5 mm. Other physical characteristics the forward protective layer may include: a tensile strength of greater than 20 MPa (as measured by JIS K7127); tensile elongation of 1% or greater (as measured by JIS K7127); and/or a water absorption (23° C., 24 hours) of 0.05% or less (as measured per ASTM D570); and/or a coefficient of linear expansion ("CLTE") of about $5\times10^{-6}$ mm/mm° C. to $100\times10^{-6}$ mm/mm° C., more preferably of about $10\times10^{-6}$ mm/mm° C. to $80\times10^{-6}$ mm/mm° C., and most preferably from about $20\times10^{-6}$ mm/mm° C. to $50\times10^{-6}$ mm/mm° C. Other physical characteristics, the forward protective layer may include: a coefficient of linear expansion ("CLTE") of about $5\times10^{-6}$ mm/mm° C. to about $140\times10^{-6}$ mm/mm° C., preferably of about $7\times10^{-6}$ mm/mm° C. to about $50\times10^{-6}$ mm/mm° C., more preferably from about $8\times10^{-6}$ mm/mm° C. to about $30\times10^{-6}$ mm/mm° C., and most preferably from about $9\times10^{-6}$ mm/mm° C. to about $15\times10^{-6}$ mm/mm° C. The forward protective layer may include: a density of about 2.42 g/cm$^3$ to about 2.52 g/cm$^3$, a tensile strength of between about 75 to 200 N/sq·mm, a compressive strength of between 500 and 1200 N/sq·mm, a modulus of elasticity of from about 60 GPa to about 80 GPa, a CLTE of about $9\times10^{-6}$ mm/mm° C., and a visible light transmission of at least about 85 percent, preferably about at least 87 percent, more preferably at least about 90 percent. The rearward protective layer and the forward protective layer may be made of the same or similar materials such that one or more of the characteristic discussed herein for the forward layer may describe a characteristic of the rearward layer.

The forward protective layer, the rearward protective layer, or both may be substantially shatter proof, substantially crack proof, dent resistant, impact resistant, scratch resistant, puncture resistant, or a combination thereof. The forward protective layer, the rearward protective layer, or both preferably have sufficient strength so that they can withstand the same static loads, dynamic loads, or both discussed herein for the reinforcement. The forward protective layer, the rearward protective layer, or both may be made of any material that has sufficient strength so that the forward protective layer, the rearward protective layer, or both may withstand a static load of 50 Kg or more, preferably about 75 Kg or more, more preferably about 100 Kg or more, or even more preferably about 125 Kg or more. The forward protective layer, the rearward protective layer, or both may be made of any material that has sufficient strength so that the forward protective layer, the rearward protective layer, or both may withstand a dynamic load having a kinetic energy of about 2 J or more, preferably about 5 J or more, more preferably about 10 J or more, even more preferably about 15 J or more, or most preferably about 20 J or more. The forward protective layer, the rearward protective layer, or both may be made of glass, a poly(mathyl methacrylate) (PMM), alkali-aluminosilicate, lotus Glass™, reinforced fiber transparent material, or a combination thereof. Preferably, the forward protective layer is made of glass. The forward protective layer, the rearward protective layer, or both may be made of any material that is puncture resistant, cut resistant, or both. Preferably, the rearward protective layer is made of thermoplastic polyolefin.

The forward protective layer, the rearward protective layer, or both may be connected to a forward surface or a rearward surface respectively of the reinforcement so that the outermost surface is the forward protective layer, the rearward protective layer, or both. The reinforcement may be sandwiched between the forward protective layer and the rearward protective layer. The forward protective layer, the rearward protective layer, or both may be connected to the reinforcement inside of an outward surface of the reinforcement so that an outward surface of the reinforcement extends beyond the forward protective layer, the rearward protective layer, or both. The forward protective layer, the rearward protective layer, or both may be connected to the reinforcement so that a gap is formed between the forward protective layer, the rearward protective layer, or both and the one or more cells of the solar module. The gap may be any size so that the forward protective layer, the rearward protective layer, or both are free of contact with the one or more cells during a load apply. The gap between the forward protective layer, the rearward protective layer, or both and the one or more cells may be greater than about 0 mm, preferably about 0.1 mm or more, more preferably about 0.5 mm, even more preferably about 1 mm, or most preferably about 2 mm. The gap between the forward protective layer, the rearward protective layer, or both and the one or more cells may about 10 mm or less, preferably about 8 mm or less, or more preferably about 5 mm or less. The forward protective layer, the rearward protective layer, or both may be connected to the reinforcement so that the gap remains substantially constant during movement, loading, installation, or a combination thereof.

The forward protective layer, the rearward protective layer or both may be connected to the reinforcement by any structure may form: a sealed connection, a permanent connection, a removable connection, or a combination thereof. The connection between the forward protective layer and the reinforcement and the rearward protective layer and the reinforcement may be made in the same manner, a different manner, or a combination of both. The connection may be any connection that has sufficient strength so that the forward protective layer, the rearward protective layer, or both may withstand a static load of 50 Kg or more, preferably about 75 Kg or more, more preferably about 100 Kg or more, or even more preferably about 125 Kg or more. The connection may be any connection that has sufficient strength so that the forward protective layer, the rearward protective layer, or both may withstand a dynamic load having a kinetic energy of about 2 J or more, preferably about 5 J or more, more preferably about 10 J or more, even more preferably about 15 J or more, or most preferably about 20 J or more. The connection may be a mechanical connection, a chemical connection, or both. The connection may be made using an adhesive, a weld, a sealant, a hook and loop fastener, a mechanical interlock, a friction fit, an interference fit, a tongue and groove, a screw, a fastener, or a combination thereof. For example, a connection may be a groove in the reinforcement that the forward protective layer and/or the rearward layer slide into, and the groove may include an adhesive that forms a sealed connection between the forward protective layer and the reinforcement and/or the rearward layer and the reinforcement. The forward protective layer, the rearward protective layer, or both may form an encapsulating layer.

The forward layer, the rearward layer, or both may be one of a plurality of encapsulating layers. An encapsulating layer, a first encapsulating layer, or both may be disposed below the forward protective layer and generally above the one or more solar cells, above the rearward protecting layer and below the one or more solar cells, or both. The encapsulating layer may include one or more layers above and/or below the solar cells. The encapsulating layer may serve as a bonding mechanism, helping hold the adjacent layers together. The encapsulating layer may allow the transmission of a desirous amount and type of light energy to reach the one or more solar cells. The encapsulating layer may function to compensate for irregularities in geometry of the adjoining layers or translated through those layers (e.g. thickness changes). The encapsulating layer may allow flexure and movement between layers due to temperature change and physical movement and bending. The encapsulating layer may be located over the reinforcement so that the reinforcement is adhered to the forward protective layer, the rearward protective layer, the one or more solar cells, or a combination thereof; entirely or partially over and/or between one or more layers of the solar module; within one or more internal layers of the solar module; along a rear side of the solar module; along one or more sides of the solar module; or a combination thereof. Preferably, each solar cell is substantially encapsulated by an encapsulating layer. The encapsulating layer may be made of any material that that protects the soar module, each solar cell, or both from a fluid. The encapsulating layer may protect the solar module, each solar cell, or both from water, water vapor, acid rain, or a combination thereof. The encapsulating layer may include an adhesive film, mesh, liquid, or both; preferably an EVA (ethylene-vinyl-acetate), thermoplastic polyolefin, polyurethanes, ionomers, silicon based polymers or similar material. The liquid encapsulating layer may be cured during application, after application, or a combination thereof. The liquid encapsulating layer may be heat cured, radiation cured, ultraviolet light (UV) cured, chemically cured (e.g., a two part), or a combination thereof. The liquid encapsulating layer may include silicone, rubber, an acrylate, polyurethane, an acrylate modified thermoset resin. The encapsulating layer may have a thickness from about 0.1 mm to 1.0 mm, more preferably from about 0.2 mm to 0.8 mm, and most preferably from about 0.25 mm to 0.5 mm. A back layer may be located between the encapsulating layer and the rearward protecting layer.

The back layer may serve as an environmental protection layer (e.g. to keep out moisture and/or particulate matter from the layers above). The back layer may be constructed of a flexible material (e.g. a thin polymeric film, a metal foil, a multi-layer film, or a rubber sheet). The back layer may be made of a material that is moisture impermeable and has a thickness from about 0.05 mm to 10.0 mm, more preferably from about 0.1 mm to 4.0 mm, and most preferably from about 0.2 mm to 0.8 mm. Other physical characteristics of the back layer may include: elongation at break of about 20% or greater (as measured by ASTM D882); tensile strength of about 28 MPa or greater (as measured by ASTM D882); and tear strength of about 70 kN/m or greater (as measured with the Graves Method). Examples of preferred materials include: glass plate; aluminum fait; poly (vinyl fluoride) (for example, commercially available as Tedlar® (a trademark of DuPont)); poly (ethylene terephthalate); copolymer of tetrafluoroethylene and hexafluoroethylene (also known as "FEP"); poly (ethylene tetrafluoroethylene): poly (ethylene naphthalate); poly (methyl methacrylate); and polycarbonate; or a combination thereof. The back layer may directly contact a rearward protective layer, or the rearward protective layer may contact an encapsulating layer, or a combination of both.

The rearward protective layer may act as a barrier, protecting the layers above from environmental conditions and from physical damage that may be caused by any features of the structure on which the solar module is subjected to (e.g. irregularities in a roof deck, protruding objects, or the like). The rearward protective layer may serve the same functions as the forward protective layer, the encapsulating layer, or both including bridging and sealing functions. The rearward protective layer material may be at least partially moisture impermeable and also range in thickness from about 0.25 mm to 10.0 mm, more preferably from about 0.5 mm to 2.0 mm, and most preferably from 0.8 mm to 1.2 mm. The rearward protective layer may exhibit elongation at break of about 20% or greater (as measured by ASTM 0882); tensile strength or about 10 MPa or greater (as measured by ASTM 0884 and tear strength of about 35 kN/m or greater (as measured with the Graves Method). The rearward protective layer may be made of thermoplastic polyolefin ("TPO"), thermoplastic elastomer, olefin block copolymers ("OBC"), natural rubbers, synthetic rubbers, polyvinyl chloride, other elastomeric and plastomeric materials, or a combination thereof. Alternately rearward protective layer could be comprised of more rigid materials so as to provide additional roofing function under structural and environmental (e.g. wind) loadings. Rigidity may also be desirable so as to improve the coefficient of thermal expansion of the solar module and maintain the desired dimensions during temperature fluctuations. Examples of rearward protective layer materials for structural properties include polymeric materials such polyolefins, polyesters, polyamides, polyimides, polyester amides, polysulfone, acetal, acrylic, polyvinyl chloride, nylon, polycarbonate, phenolic, polyetheretherketone, polyethylene terephthalate, epoxies, including glass and mineral filled composites or any combination thereof.

The above described layers may be configured or stacked in a number of combinations, but it is preferred that the forward protective layer is the top layer. Additionally, these layers may be integrally joined together via any number of methods, including but not limited to: adhesive joining; heat or vibration welding; over-molding; mechanical fasteners, or a combination thereof.

Figure 1:
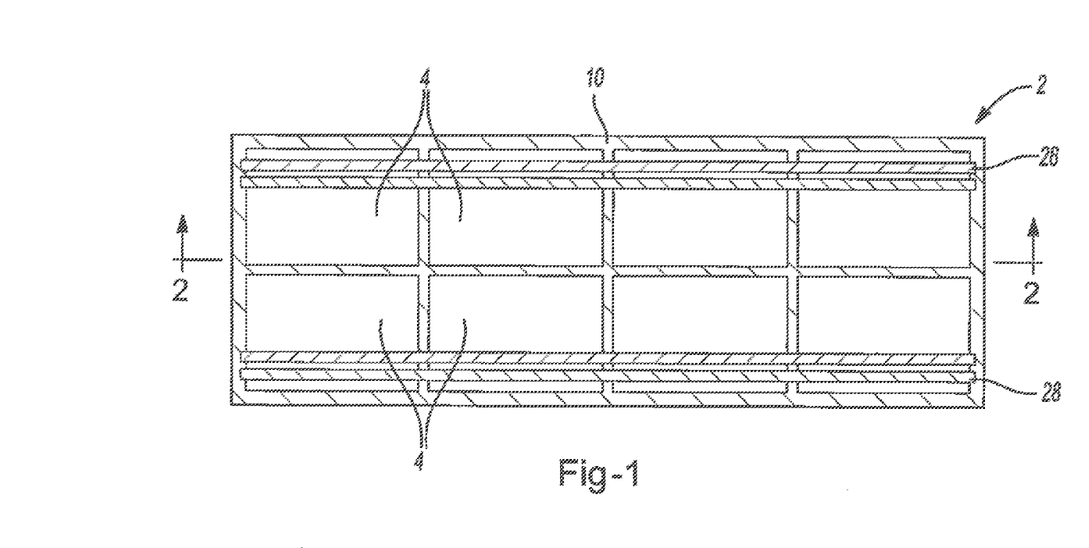
FIG. 1 illustrates an example of a solar module including one possible reinforcement of the teachings herein.

FIG. 1 illustrates one solar module 2. The solar module 2 as illustrated includes eight individual cells 4. Each of the individual ells 4 are electrically connected to form one single solar module 2. The cells 4 are electrically connected via one or more ribbons 28 that extend between the cells. The solar module 2 includes an integrally formed reinforcement 10.

Figure 2:
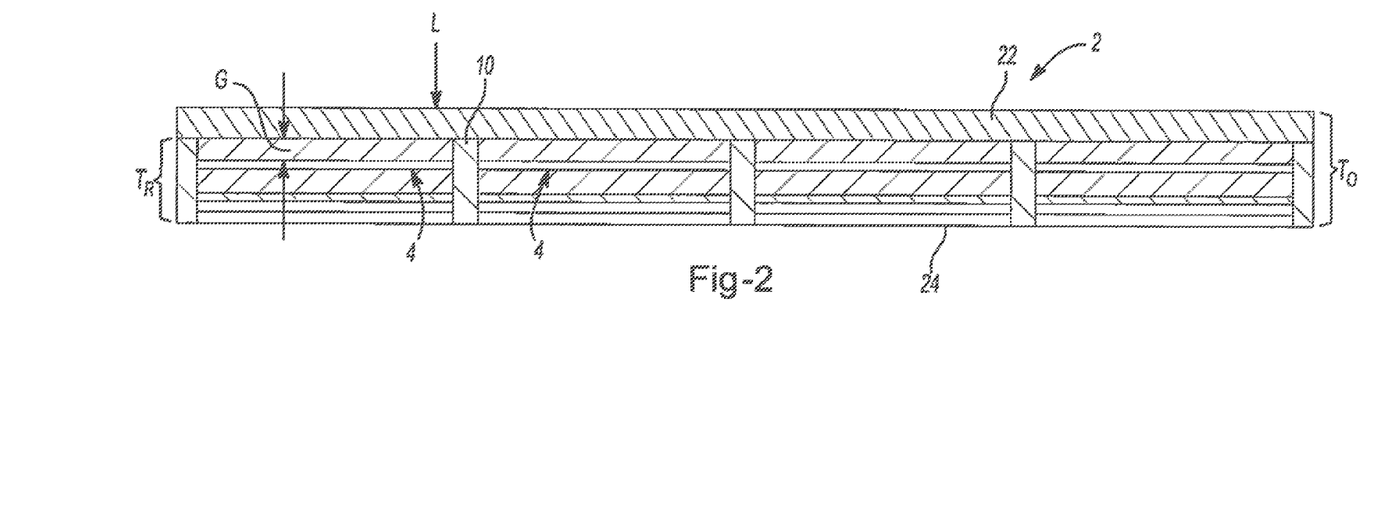
FIG. 2 illustrates a cross-sectional view of FIG. 1.

FIG. 2 illustrates a cross-sectional view of the solar module 2 of FIG. 1. As illustrated, the solar module 2 includes a transparent forward protective layer 22 and a rearward protective layer 24. A gap (G) is formed between the forward protective layer 22 and the cells 4 by the reinforcement 10 extending above each cell 4 and supporting the forward protective layer 22. A photovoltaic cell 4 for producing power is located between the forward protective layer 22 and the rearward protective layer 24. As illustrated, the solar module 2 has a thickness ($T_o$) with a reinforcement 10 extending between the forward protective layer 22 and the rearward protective layer 24 so that the reinforcement 10 has a thickness ($T_R$) that protects the photovoltaic substrate from movement due to a bad (L) such as a static load, a dynamic load, or both.

Figure 3:
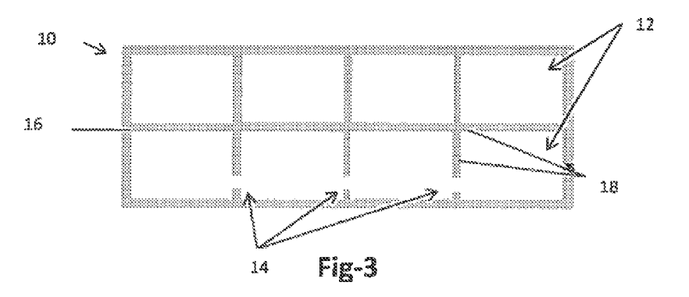
FIG. 3 illustrates one example of a reinforcement of the teachings herein.

FIG. 3 illustrates a reinforcement 10 that includes an outer frame 16 and an inner frame 18. The reinforcement 10 includes channels 14. As illustrated, the channels 14 extend through the inner frame 18. Windows 12 are formed between the inner frame 18 and the outer frame 16 so that the cells (not shown) are located within and protected by the reinforcement 10.

Figure 4A:
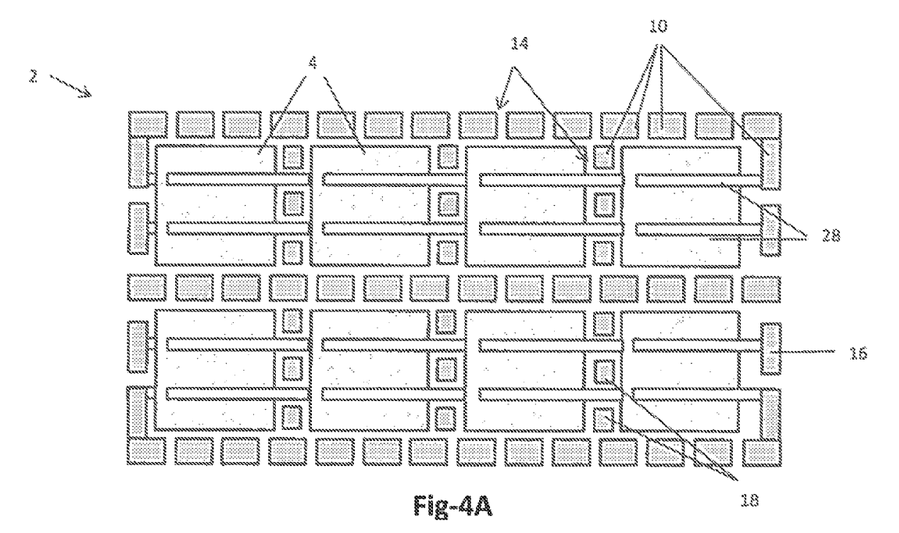
FIGS. 4A-4D illustrate examples of various reinforcements of the teachings herein.
Figure 4B:
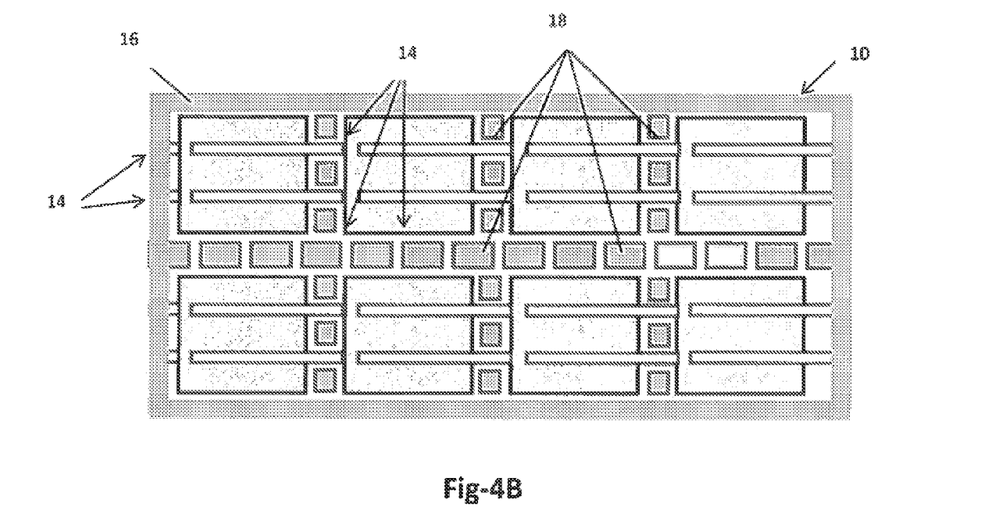
Figure 4C:
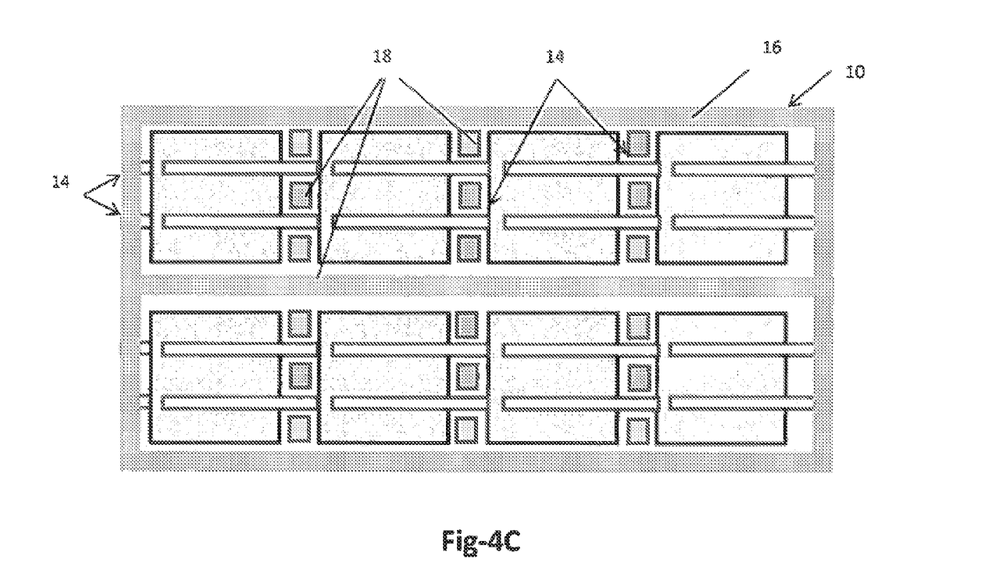
Figure 4D:
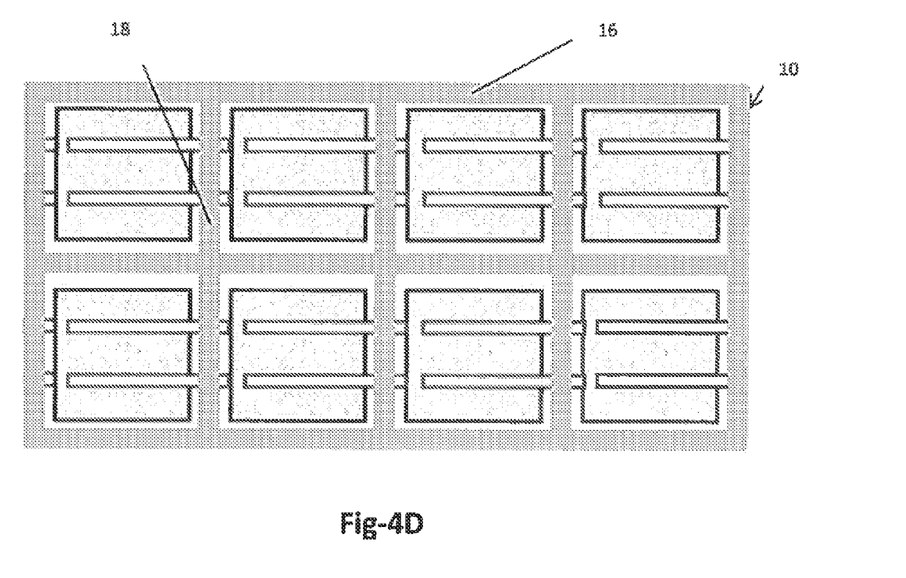

FIGS. 4A-4D illustrate various configurations for the reinforcement 10 of a solar module 2. FIG. 4A illustrates a reinforcement 10 surrounding solar cells 4. Ribbons 28 extend between and connect the cells 4. The reinforcement 10 includes an inner frame 18 and an outer frame 16. Both the inner frame 18 and the outer frame 16 include channels 14. FIG. 4B illustrates a reinforcement 10 having an outer frame 16 and an inner frame 18. The outer frame 16 has channels 14 through a central portion and the inner frame includes channels 14 through a top portion. FIG. 4C illustrates a reinforcement 10 having an outer frame 16 and an inner frame 18. The outer frame 16 includes channels 14 through a central portion, and the inner frame 18 has a portion that is free of channels and a portion that includes channels 14 that extend completely through the inner frame 18. FIG. 4D illustrates a reinforcement 10 where channels 10 extend through a central portion of both the outer frame 16 and the inner frame 18.

Figure 5A:
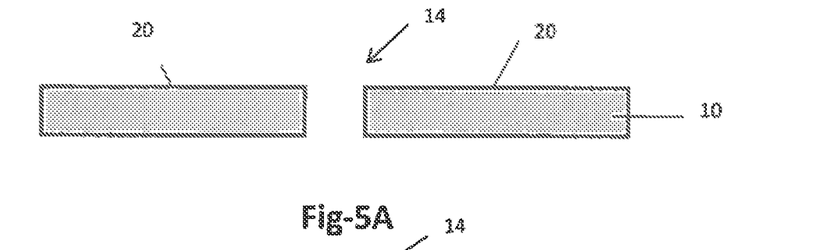
FIGS. 5A-5D illustrate examples of channel locations in the reinforcement.
Figure 5B:
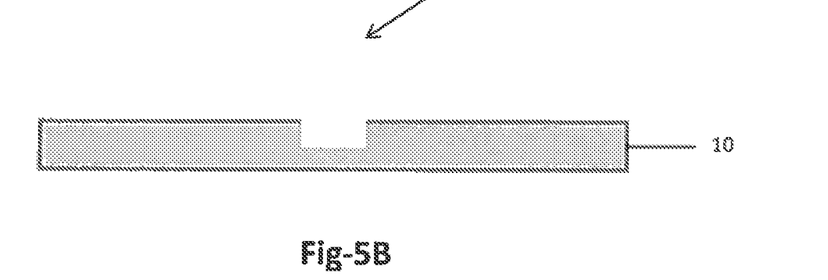
Figure 5C:
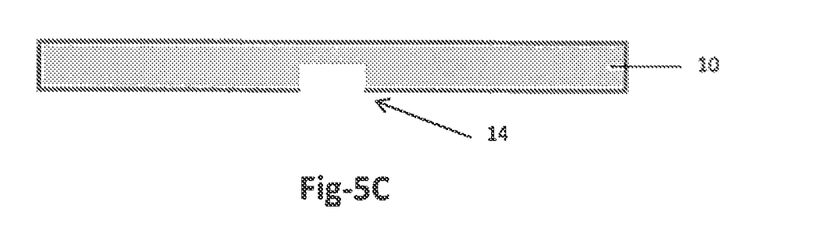
Figure 5D:
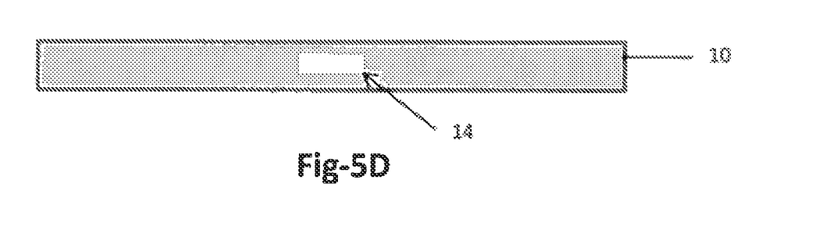

FIGS. 5A-5D illustrate various configurations for the channels 14 in the reinforcements 10. FIG. 5A illustrates a reinforcement 10 that includes a channel 14 extending completely through the reinforcement 10 so that two discrete segments 20 are formed. FIG. 58 illustrates a reinforcement 10 with a channel 14 extending through an upper portion. FIG. 5C illustrates a reinforcement 10 with a channel 14 extending through a lower portion. FIG. 50 illustrates a reinforcement 10 with a channel 14 extending through a central portion.

Figure 6:
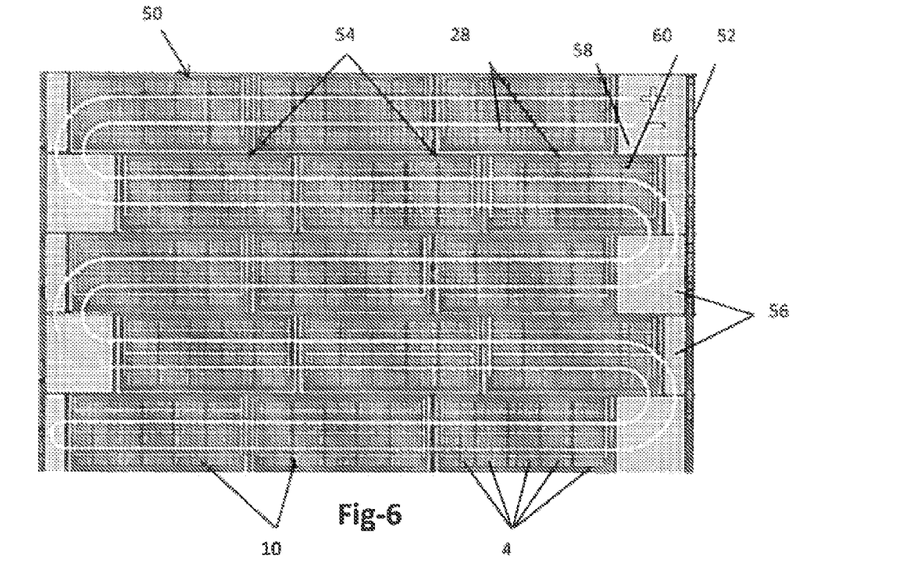
FIG. 6 illustrates a plurality of solar modules on a roof structure forming a portion of a solar array.

FIG. 6 illustrates a solar array 50 including a plurality of solar modules 10 each including a plurality of solar cells 4. The solar cells 4 are connected together via ribbons 28. Each of the solar modules 10 are electrically connected together via connectors 54 that connect the positive buss bar 58 and the negative buss bar 60 of each of the solar modules 10 together so that power can flow through the solar array 50. The rows of solar modules 10 are connected together via one or more integrated flashing pieces 56. The solar array 50 is connected to a connection surface 52, which supports the solar array 50.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

We claim:

1. A solar module comprising:
    a. a plurality of interconnected photovoltaic cells;
    b. a forward protective layer;
    c. a rearward protective layer; and
    d. an encapsulating layer disposed below the forward protective layer and above the plurality of interconnected photovoltaic cells, above the rearward protective layer and below the plurality of interconnected photovoltaic cells, or both;
    wherein the solar module includes a reinforcement including:
        i. an outer frame that extends partially and/or entirely around an outer edge of the solar module, and
        ii. an inner frame that is surrounded by and directly connected to the outer frame;
    wherein the inner frame includes a top surface and a bottom surface and one or more channels extend through a central portion of the inner frame between the top surface and the bottom surface;
    wherein the plurality of interconnected photovoltaic cells are electrically connected together and one or more interconnect elements extend through the one or more channels to connect two or more of the plurality of interconnected photovoltaic cells electrically together;
    wherein the plurality of interconnected photovoltaic cells are incorporated within the reinforcement, the reinforcement is integrally located within the solar module, the outer frame and the inner frame are sandwiched between the forward protective layer and the rearward protective layer, and the inner frame of the reinforcement is incorporated between each of the plurality of interconnected photovoltaic cells so that any load applied to the solar module is distributed throughout the reinforcement;

wherein the reinforcement is made of a material that has an elastic modulus of about 10 GPa or more so that the cells are substantially free of deflection when a load is applied; and wherein the solar module has a thickness of about 50 mm or less.

2. The solar module of claim 1, wherein the reinforcement has sufficient strength so that each of the plurality of interconnected photovoltaic cells are protected during a static load, a dynamic load, or both.

3. The solar module of claim 1, wherein each individual cell of the plurality of cells are substantially surrounded by the reinforcement so that the reinforcement limits deflection of each of the plurality of cells when a load is applied.

4. The solar module of claim 1, wherein the solar module is directly connected to a roof by a fastener extending through the solar module and into the roof.

5. The solar module of claim 1, wherein the plurality of interconnected photovoltaic cells comprise crystalline silicon.

6. The solar module of claim 1, wherein the solar module has a thickness of about 20 mm or less, and a thickness of the reinforcement is less than the thickness of the solar module.

7. The solar module of claim 1, wherein the reinforcement is configured to prevent a load applied to the forward protective layer, the rearward protective layer, or both from deflecting the forward protective layer, the rearward protective layer, or both into contact with the plurality of interconnected photovoltaic cells.

8. The solar module of claim 1, wherein the reinforcement has a sufficient strength so that the reinforcement can withstand a static load of 50 Kg -125 Kg or a dynamic load having a kinetic energy of about 5 J -20 J.

9. The solar module of claim 1, wherein the reinforcement has a corrugated structure, a honeycomb structure, or both.

10. A solar array comprising:
a plurality of solar modules of claim 1;
wherein the plurality of solar modules are directly attached to a connection surface.

11. The solar array of claim 10, wherein at least a portion of two or more adjacent solar modules of the plurality of solar modules overlap each other when installed, and each of the solar modules are free of a separate structure for connecting the solar modules to the connection surface.

12. The solar module of claim 2, wherein each of the plurality of cells are entirely surrounded by the inner frame or the inner frame and the outer frame of the reinforcement so that the reinforcement limits deflection of each of the plurality of cells when a load is applied.

13. The solar module of claim 4, wherein the forward protective layer and the rearward protective layer are connected to the reinforcement.

14. The solar module of claim 13, wherein the encapsulating layer is located over the reinforcement and adheres the reinforcement to the forward protective layer and the rearward protective layer.

15. The solar module of claim 14, wherein the reinforcement is made of a material with an elastic modulus of about 30 GPa or more, and the reinforcement and the forward protective layer have sufficient strength to withstand a static load of about 75 Kg and a dynamic load having a kinetic energy of about 10 J -20 J.

* * * * *